US012419090B2

(12) United States Patent
Vanpaemel et al.

(10) Patent No.: US 12,419,090 B2
(45) Date of Patent: Sep. 16, 2025

(54) N-TYPE DOPED GERMANIUM MONOCRYSTALS AND WAFERS DERIVED THEREFROM

(71) Applicant: UMICORE, Brussels (BE)

(72) Inventors: Johannes Vanpaemel, Olen (BE); Kristof Dessein, Olen (BE); Ben Depuydt, Olen (BE)

(73) Assignee: UMICORE, Brussels (BE)

( * ) Notice: Subject to any disclaimer, the term of this patent is extended or adjusted under 35 U.S.C. 154(b) by 187 days.

(21) Appl. No.: 17/905,985

(22) PCT Filed: Mar. 12, 2021

(86) PCT No.: PCT/EP2021/056395
§ 371 (c)(1),
(2) Date: Sep. 9, 2022

(87) PCT Pub. No.: WO2021/123461
PCT Pub. Date: Jun. 24, 2021

(65) Prior Publication Data
US 2023/0170391 A1 Jun. 1, 2023

(30) Foreign Application Priority Data

Mar. 12, 2020 (EP) .................................... 20162639
Dec. 14, 2020 (WO) ................. PCT/EP2020/086017

(51) Int. Cl.
| | |
|---|---|
| C30B 15/04 | (2006.01) |
| C30B 29/08 | (2006.01) |
| C30B 33/10 | (2006.01) |
| H01L 21/02 | (2006.01) |
| H10D 62/834 | (2025.01) |

(52) U.S. Cl.
CPC .......... *H10D 62/834* (2025.01); *C30B 15/04* (2013.01); *C30B 29/08* (2013.01); *C30B 33/10* (2013.01); *H01L 21/02008* (2013.01)

(58) Field of Classification Search
CPC ......... C30B 15/04; C30B 29/08; C30B 33/10; H01L 29/167; H01L 21/02008
See application file for complete search history.

(56) References Cited

U.S. PATENT DOCUMENTS

| | | | |
|---|---|---|---|
| 7,132,091 | B2 | 11/2006 | Kulkarni et al. |
| 7,341,787 | B2 | 3/2008 | Krautbauer et al. |
| 8,574,363 | B2 | 11/2013 | Kawazoe et al. |
| 2005/0167001 | A1 | 8/2005 | Krautbauer et al. |
| 2010/0116196 | A1 | 5/2010 | Liu |

FOREIGN PATENT DOCUMENTS

| | | | | |
|---|---|---|---|---|
| JP | 2010275181 A | | 12/2010 | |
| JP | 2012508153 A | | 4/2012 | |
| TW | I397619 | * | 11/2005 | |
| TW | 201730961 A | * | 9/2017 | ....... H01L 21/02052 |
| WO | 2010053586 A2 | | 5/2010 | |

OTHER PUBLICATIONS

Sumathi et al (journal of Crystal Growth) Growth of heavily-doped Germanium single crystals for mid-Infrared applications vol. 535 year 2020, january.*
ISR/EP; International Search Report and Written Opinion for International Patent Application No. PCT/EP2021/056395 dated May 18, 2021, 12 pages.
Camacho-Aguilera, Rodolfo E., et al., "An electrically pumped germanium laser", Optics Express, vol. 20, No. 10, May 7, 2012, 5 pages.
Bomers, Mario, et al., "Microfluidic surface-enhanced infrared spectroscopy with semiconductor plasmonics for the fingerprint region", Reaction chemistry & engineering, vol. 5, No. 124, 2020, 12 pages.
Frigerio, Jacopo, et al., "Tunability of the dielectric function of heavily doped germanium thin films for mid-infrared plasmonics", Physical Review B 94, 085202, 2016, 18 pages.
Spitzer, W.G., et al., "Properties of Heavily Doped n-Type Germanium", Journal of Applied Physics, vol. 32, No. 10, 1822, Oct. 1961, 9 pages.
Moriyama, Yoshihiko, et al., "In situ doped epitaxial growth of highly dopant-activated n+ -Ge layers for reduction of parasitic resistance in Ge-nMISFETs", Applied Physics Express, The Japan Society of Applied Physics, Express 7 106501, 2014, 5 pages.
JPO: Notice of Reasons for Rejection in Japanese Patent Application No. 2022-554691, mailed Sep. 30, 2024, 4 pages.
Sumathi Radhakrishnan. R., et al., "Growth of heavily-doped Germanium single crystals for mid-Infrared applications", Journal of Crystal Growth, Elsevier, Jan. 2020, vol. 535, 7 pages.
Korean Intellectual Propert Office: Office Action for Korean Patent Application No. 10-2022-7035197, mailed Feb. 24, 2025, 11 pages.

* cited by examiner

*Primary Examiner* — Robert M Kunemund
(74) *Attorney, Agent, or Firm* — NK Patent Law

(57) ABSTRACT

The invention concerns monocrystalline dislocation-free Ge, n-type doped, and having a resistivity of less than 10 mOhm·cm, characterized in that phosphorus is the single dopant. Such crystals can be obtained by using the Czochralski pulling technique with GeP as dopant.

13 Claims, No Drawings

N-TYPE DOPED GERMANIUM MONOCRYSTALS AND WAFERS DERIVED THEREFROM

CROSS-REFERENCE TO RELATED APPLICATIONS

This application is a U.S. National Stage application of International Patent Application No. PCT/EP2021/056395, filed on Mar. 12, 2021, which claims the benefit of International Patent Application No. PCT/EP2020/086017, filed on Dec. 14, 2020, and the benefit of European Patent Application No. 20162639.7, filed on Mar. 12, 2020.

TECHNICAL FIELD

The present invention concerns a process for the manufacture of dislocation-free monocrystalline Ge, n-type doped with phosphorus, and having a resistivity of less than 10 mOhm·cm. It also concerns the n-type doped material in the form of large diameter bulk crystals, as well as the wafers derived from these crystals.

BACKGROUND

Electronic and opto-electronic device manufacturers require commercially grown, large and uniform germanium single semiconductor crystals which, when sliced and polished, provide substrates for microelectronic device production. The market for n-type Ge wafers is mainly for opto-electronic devices such as vertical-cavity surface emitting lasers (VCSEL) or mid-infrared plasmonic sensors. A VCSEL is a type of semiconductor laser diode with laser beam emission perpendicular from the top surface. VCSELs are used in various laser products, including computer mice, fiber optic communications, laser printers, face recognition, and smart glasses. Plasmonic sensors are based on collective oscillations of free electrons and are suited for various applications such as the detection of molecules.

N-type doping and a low resistivity are desirable for these applications, as high electron densities achieved in these highly doped wafers enable the plasmonic effect in the germanium films. However, dislocations often degrade their performance.

P-type doped germanium wafers, on the other hand, are not suitable for infra-red plasmonics due to the large plasmonic losses, Frigerio et al., Physical Review B 94, 085202, 2016.

Low resistivity dislocation-free semiconductor wafers have been described in U.S. Pat. No. 7,341,787. Very low resistivities are envisaged, such as lower than 2 mOhm·cm. To this end, at least two electrically active dopants, which belong to the same group of the periodic system of elements, are simultaneously added. This is said to avoid the problem that, above certain concentrations, some of the dopant atoms incorporated in the semiconductor material may be electrically inactive. This document, although mentioning Si, Ge, and Si—Ge alloys, is clearly dedicated to the doping of Si. No details are disclosed with respect to Ge, and in particular also not for the source of the dopants used.

Spitzer et al., J. Appl. Phys. 32, 1822, 1961, describe the preparation of Ge single crystals heavily doped with Sb, As, and P. Resistivities well below 2 mOhm·cm are reported. Herein, the phosphorus-doped samples are all obtained by pulling single crystals with calcium orthophosphate as the source. However, the use of calcium orthophosphate as dopant will necessarily preclude obtaining dislocation-free crystals, as shown in the Comparative Example below.

U.S. Pat. No. 8,574,363 teaches that a high doping level in a silicon-based semiconductor crystal can also be obtained by using a so-called dopant chamber that, for example, includes phosphorus. The chamber is brought into close proximity of the melt. When the temperature is raised to the melting point of phosphorus, the phosphorus is released as a gas, and a part of it will be incorporated into the melt, while the rest is lost to the environment. The gas phase operation thus requires additional attention and calculations to predict the amount of phosphorous released to the melt. In case of doping silicon with phosphorous and germanium, U.S. Pat. No. 8,574,363 further teaches the use of two separate chambers, one for phosphorous, supplied via evaporation, the other for germanium, supplied by liquefication. U.S. Pat. No. 7,132,091 indicates using a dopant chamber where the cover is partially dissolved when lowering it into the melt. The usage of such a chamber can introduce undesired contaminants into the melt.

SUMMARY

To this aim, the present invention provides doped n-type germanium monocrystals and wafers derived therefrom. In a first aspect, the present invention provides an n-type doped Ge monocrystal, wherein phosphorus is a single dopant. This simplifies the process and allows a better process control, but also a more precise prediction of the resistivity of a formed crystal ingot. The combination of a high n-type doping with the fact that the wafers are dislocation-free unlocks possibilities to enhance the behavior of the aforementioned opto-electronic devices.

In a second aspect, the present invention provides in a wafer comprising an n-type doped Ge monocrystal according to the first aspect of the invention. More specifically, said n-type doped, monocrystalline Ge wafer comprises phosphorus as a single dopant. Such monocrystals are dislocation-free, and preferably have a resistivity of less than 10 mOhm·cm.

In a third aspect, the present invention provides in a process for the manufacture of an n-type doped Ge monocrystal according to the first aspect of the invention, comprising the steps of:
providing a Czochralski pulling furnace;
feeding germanium and phosphorus into the furnace in such relative quantities as to obtain a dopant level of at least $1 \times 10^{18}/cm^3$; and,
pulling a crystal.

DETAILED DESCRIPTION OF THE INVENTION

Unless otherwise defined, all terms used in disclosing the invention, including technical and scientific terms, have the meaning as commonly understood by one of ordinary skill in the art to which this invention belongs. By means of further guidance, term definitions are included to better appreciate the teaching of the present invention.

As used herein, the following terms have the following meanings:

"A", "an", and "the" as used herein refers to both singular and plural referents unless the context clearly dictates otherwise. By way of example, "a compartment" refers to one or more than one compartment.

"About" as used herein referring to a measurable value such as a parameter, an amount, a temporal duration, and the like, is meant to encompass variations of +/−20% or less, preferably +/−10% or less, more preferably +/−5% or less, even more preferably +/−1% or less, and still more preferably +/−0.1% or less of and from the specified value, in so far such variations are appropriate to perform in the disclosed invention. However, it is to be understood that the value to which the modifier "about" refers is itself also specifically disclosed.

"Comprise," "comprising," and "comprises" and "comprised of" as used herein are synonymous with "include", "including", "includes" or "contain", "containing", "contains" and are inclusive or open-ended terms that specifies the presence of what follows e.g. component and do not exclude or preclude the presence of additional, non-recited components, features, element, members, steps, known in the art or disclosed therein.

The recitation of numerical ranges by endpoints includes all numbers and fractions subsumed within that range, as well as the recited endpoints. All percentages are to be understood as percentage by weight, abbreviated as "wt. %", unless otherwise defined or unless a different meaning is obvious to the person skilled in the art from its use and in the context wherein it is used.

The growth of a semiconductor crystal according to the present invention involves heating raw material to its melting point to create a crystalline raw material melt, bringing the melt into contact with a high quality seed crystal, and allowing the crystallization of the melt when in contact with the seed crystal. A number of different processes for accomplishing this are known. These include the Czochralski (Cz) process and its variant the Liquid Encapsulated Czochralski (LEC) process, the Horizontal Bridgman and Bridgman-Stockbarger processes (HB) and their vertical variants (VB), and the gradient freeze (GF) and its variant, the vertical gradient freeze (VGF) processes. Such techniques are described in "Bulk Crystal Growth of Electronic, Optical and Optoelectronic Materials" P. Clapper, Ed., John Wiley and Sons Ltd, Chichester, England, 2005.

The crystallization of the melt forms an essentially cylindrical crystal, referred to as an ingot, along a vertical axis with the seed crystal below the crystalline raw material(s). The equipment necessary to form the semiconductor crystal includes a crystal growth furnace, a crucible, and sometimes a crucible support.

In a first aspect, the present invention provides in an n-type doped Ge monocrystal, wherein phosphorus is a single dopant. This simplifies the process and allows a better process control, but also a more precise prediction of the resistivity of a formed crystal ingot. The combination of a high n-type doping with the fact that the wafers are dislocation-free unlocks possibilities to enhance the behavior of the aforementioned opto-electronic devices.

Preferably, said Ge monocrystal is substantially dislocation-free. In the context of the present invention, the term "substantially dislocation-free" is to be interpreted as having less than 0.025 dislocations per $cm^2$, preferably less than 0.005 dislocations per $cm^2$, and more preferably less than 0.001 dislocations per $cm^2$. Most preferably, said Ge monocrystal has no dislocations, and is thus dislocation-free. The dislocations which occur in crystals grown by the Czochralski method can be determined by etching and/or copper decoration techniques. Sources of dislocations include thermal shock from surface damage or residual dislocations in the seed; poor epitaxy at the seed; plastic generation in the bulk of the crystal; effects of segregation of impurities. The skilled person will appreciate that it is possible to eliminate residual dislocations and thenceforth grow a dislocation-free crystal, e.g. by Dash-necking. In a preferred embodiment, the Ge monocrystal according to the invention is produced in a procedure wherein the crystal growth furnace produces a crystal ingot having no dislocations or lineage. Preferably, said ingots are grown by a vertical growth process.

In a preferred embodiment, the present invention provides in an n-type doped Ge monocrystal, wherein said dopant is comprised in an amount of at least $5\times10^{17}/cm^3$, preferably in an amount of $5\times10^{17}/cm^3$ to $2.5\times10^{19}/cm^3$, more preferably in an amount of $1\times10^{18}/cm^3$ to $2.5\times10^{19}/cm^3$, and even more preferably in an amount of $1\times10^{18}/cm^3$ to $6\times10^{18}/cm^3$, or any value there in between.

In a preferred embodiment, the present invention provides in an n-type doped Ge monocrystal, wherein said Ge monocrystal has a resistivity of less than 10 mOhm·cm, and preferably between 1 mOhm·cm and 10 mOhm·cm, and more preferably between 1 mOhm·cm and 7 mOhm·cm. Most preferably, said resistivity is between 2 mOhm·cm and 6 mOhm·cm, such as 2.0 mOhm·cm, 3.0 mOhm·cm, 4.0 mOhm·cm, 5.0 mOhm·cm, 6.0 mOhm·cm, or any value there in between.

Said monocrystal may have In a preferred embodiment, the present invention provides in an n-type doped Ge monocrystal, wherein said monocrystal is substantially cylindrical and has a diameter of 1 cm to 50 cm, more preferably a diameter of 5 cm to 35 cm. Most preferably, said diameter is about 100 mm or 4 inch, about 150 mm or 6 inch, about 200 mm or 8 inch, or about 300 mm or 12 inch, or any diameter there in between. Preferably, said Ge monocrystal is in the form of an ingot, more preferably in the form of a Czochralski-grown crystal ingot.

In a preferred embodiment, the present invention provides in an n-type doped Ge monocrystal, wherein said monocrystal is substantially cylindrical and has a length of 1 cm to 300 cm, preferably a length of 5 cm to 200 cm, and more preferably a length of 10 cm to 150 cm, such as 30 cm, 45 cm, 60 cm, 75 cm, 90 cm, 105 cm, 120 cm, or 135 cm, or any length there in between.

In a second aspect, the present invention provides in a wafer comprising an n-type doped Ge monocrystal, preferably according to the first aspect of the invention. More specifically, said n-type doped, monocrystalline Ge wafer comprises phosphorus as a single dopant. Such monocrystals are dislocation-free, and preferably have a resistivity of less than 10 mOhm·cm. Preferably, said resistivity is between 1 mOhm·cm and 10 mOhm·cm, and more preferably between 1 mOhm·cm and 7 mOhm·cm. Most preferably, said resistivity is between 2 mOhm·cm and 6 mOhm·cm, such as 2.0 mOhm·cm, 3.0 mOhm·cm, 4.0 mOhm·cm, 5.0 mOhm·cm, 6.0 mOhm·cm, or any value there in between.

In a preferred embodiment, the present invention provides a wafer according to the second aspect of the invention whereby said wafer is obtained by cutting from a monocrystal ingot, preferably a Czochralski-grown monocrystal, said ingot having a diameter of 1 cm to 50 cm, more preferably a diameter of 5 cm to 35 cm. Most preferably, said diameter is about 100 mm or 4 inch, about 150 mm or 6 inch, about 200 mm or 8 inch, or about 300 mm or 12 inch, or any diameter there in between. Said ingot may have a length of 1 cm to 300 cm.

In a preferred embodiment, the present invention provides a wafer according to the second aspect of the invention, wherein said wafer has a thickness of 25 to 1000 μm. More preferably, said wafer has a thickness of 100 μm to 750 μm, and even more preferably, said wafer has a thickness of about 140 µm, 180 µm, 220 µm, 260 µm, 300 µm, 450 µm, 650 µm or any thickness there in between.

In a third aspect, the present invention provides in a process for the manufacture of an n-type doped Ge monocrystal according to the first aspect of the invention, comprising the steps of:
providing a Czochralski pulling furnace;
feeding germanium and phosphorus into the furnace in such relative quantities as to obtain a dopant level of at least $1 \times 10^{18}/cm^3$; and,
pulling a crystal.

In a preferred embodiment, the present invention provides a process according to the third aspect of the invention, whereby phosphorus is fed into said furnace in the form of GeP.

In a preferred embodiment, the present invention provides a process according to the third aspect of the invention, comprising the additional steps of:
cutting the crystal into wafers;
grinding the wafers with a coarse grit;
chemical-mechanical polishing of the wafers;
cleaning the wafers' surface.

In a further aspect, the present invention provides electronic or opto-electronic devices comprising an n-type doped Ge monocrystal according to the first aspect of the invention, or a wafer according to the second aspect of the invention. monocrystalline dislocation-free Ge according to the first aspect of the invention.

In a further aspect, the present invention provides vertical-cavity surface emitting lasers or infrared plasmonic sensors comprising an n-type doped Ge monocrystal according to the first aspect of the invention—either directly or after dicing to a dimension suitable for use in a vertical-cavity surface emitting laser or infrared plasmonic sensor, or a wafer according to the second aspect of the invention— either directly or after dicing to a dimension suitable for use in a vertical-cavity surface emitting laser or infrared plasmonic sensor.

In a further aspect, the present invention provides in the use of monocrystalline dislocation-free Ge according to the first aspect of the invention for vertical-cavity surface emitting lasers or infrared plasmonic sensors.

In other words, the present invention aims at the preparation of and to provide for monocrystalline dislocation-free Ge, n-type doped, and having a resistivity of less than 10 mOhm·cm, characterized in that phosphorus is the single dopant. This simplifies the process and allows a better process control, but also a more precise prediction of the resistivity of a formed crystal ingot. The combination of a high n-type doping with the fact that the wafers are dislocation-free unlocks possibilities to enhance the behavior of the aforementioned opto-electronic devices.

Another embodiment according to any previous embodiment concerns the above dislocation-free monocrystalline Ge, obtainable by supplying the phosphorus in the form of GeP. This ensures that a phosphorus-doped, monocrystalline, and dislocation-free product is obtained. Using GeP as dopant source is highly preferred over, for example, red or white phosphorus because of safety precautions needed when handling the latter two. Moreover, GeP is available in high purity (99,999%), minimizing the addition of undesired impurities to the melt.

Another embodiment according to any previous embodiment concerns dislocation-free monocrystalline Ge in the form of a Czochralski-grown crystal ingot.

Another embodiment according to any previous embodiment concerns dislocation-free monocrystalline Ge in the form of wafers derived from a Czochralski-grown crystal ingot. Such wafers may preferably have a thickness of 140 to 1000 µm, and a diameter of 5 to 35 cm.

Another embodiment according to any previous embodiment concerns the use of dislocation-free monocrystalline Ge for vertical-cavity surface emitting lasers or infrared plasmonic sensors.

To this end, a process was developed comprising the following steps:
providing a Czochralski pulling furnace;
feeding Ge and GeP into the furnace in such relative quantities as to obtain a dopant level of at least $1 \times 10^{18}/cm^3$ in the crystal; and,
pulling a crystal.

Optional additional steps are:
cutting the crystal into wafers by means of wire-sawing;
grinding the wafers with a coarse grit;
chemical-mechanical polishing;
cleaning the wafer surface.

This process is illustrated in the following Example. The following example is intended to further clarify the present invention, and is nowhere intended to limit the scope of the present invention.

EXAMPLE

A load of 100 kg of high purity germanium is introduced into a Czochralski furnace, in a graphite crucible, to which 62.3 g of GeP is added as a dopant.

This amount of dopant corresponds to a dopant level in the crystal, which varies between 1 and $6 \times 10^{18}/cm^3$, corresponding to a variation in the resistivity of about 2 to 6 mOhm·cm. The variation is due to the well-known fact of impurity segregation at the solid interface during crystal growth. As a result, the concentration of phosphorus increases towards the tail of the crystal, causing a lower resistivity there.

The furnace is first heated to 1000° C. in a nitrogen environment, so as to melt the germanium. Around 725° C., germanium phosphide dissociates into solid Ge and liquid phosphorus. At 1000° C., the germanium is also molten, and phosphorus is incorporated into the melt. When the germanium is fully molten, the temperature of the furnace is lowered to 950° C. After 6 hours, the temperature is stabilized, whereupon a germanium seed crystal is lowered through the shaft of the furnace until it contacts the molten bath. A procedure called "Dash necking", well known to the skilled person, is then executed in order to initiate the growth. More specifically, a thin 5 mm diameter crystal is grown for a length of 150 mm. The crystal is then slowly pulled up at a controlled rate of 10 mm/h so as to increase its diameter to 150 mm. The diameter of the crystal is then stabilized by controlling the heater temperature and/or the pulling rate. This phase is commonly called body growth. A pulling rate of about 10 mm/h is achieved.

At the end of the body growth, a tail is formed on the crystal by steadily reducing its diameter, whereupon the crystal is detached from the melt. This procedure is useful to minimize the thermal shock as an aid to avoid dislocations. The crystal is pulled up into the shaft of the furnace and slowly cooled to below 50° C. for 28 h. It is then unloaded from the furnace.

The crystal is sawn perpendicular to the crystal axis into cylindrical pieces, and the resistivity is measured on 6 different locations along the length of the crystal using a 4-point probe. The results are reported in Table 1.

TABLE 1

Resistivity function of the location along the body of the crystal.

| Location (distance from the start of body growth in cm) | 0 | 28 | 56 | 84 | 105 |
|---|---|---|---|---|---|
| Resistivity (Ohm · cm) | 5.9 | 4.1 | 3.8 | 3.4 | 2.3 |

It is shown that doping a germanium melt with GeP effectively results in low-resistive, n-type germanium crystals with a resistivity ranging between 2 and 6 mOhm·cm. This variation in resistivity is perfectly acceptable for the intended applications. Theoretical calculations further indicate that with these quantities of added dopant, close to all phosphorus atoms are electrically active inside of the germanium lattice.

It is then verified that a dislocation-free crystal is obtained. This is done by etching a cross sectional piece taken from the tail of the crystal with a dislocation-revealing chemical. In this case, a solution is prepared consisting of 75 g of $Cu(NO_3)_2 \cdot 3H_2O$, 300 mL $H_2O$, 300 mL $HNO_3$ (69%), and 600 mL HF (49%) to etch the crystal piece. The surface is then analyzed with a microscope to confirm the absence of dislocations.

Analyzing the tail of the crystal is sufficient to ensure that the crystal as a whole is dislocation-free, because dislocations generated in the crystal body multiply and extend towards the crystal's tail.

For the obtention of wafers, the crystal can be further processed as follows.

The crown and tail of the crystal are cropped and subsequently the crystal is ground to the desired diameter using cylindrical grinding. A flat or notch is then machined on the rounded crystal to mark the crystal orientation. Afterwards, a wire-saw cuts the crystal into individual wafers. These wafers are laser-marked with a unique identification code for tracking purposes. The edge of the wafer is rounded to prevent wafer breakage in further processing. In order to remove thickness variations that are present after sawing, the wafer surface is ground with a course grit. Any sub-surface damage induced by this process is removed by chemical etching. Then, chemical-mechanical polishing is applied until a mirror-like surface is obtained. A final clean ensures an "epi-ready" surface for the growth of various epi-layers.

COMPARATIVE EXAMPLE

In a Czochralski furnace, the crucible is filled with 2500 g of germanium and 5 g of calcium orthophosphate as dopant. The furnace is then heated to its normal operating temperature of 1100° C. It is however observed that a significant part of the dopant does not dissolve, forming particles floating on the surface of the germanium melt. The same crystal-growth and analysis procedures are performed as in the above Example. The analysis of the crystal shows multiple dislocations, probably due to the absorption of particles near the solid-liquid interface.

It therefore must be concluded that the use of calcium orthophosphate as dopant necessarily precludes the obtention of dislocation-free crystals.

The invention claimed is:

1. A phosphorous-doped, dislocation-free germanium (Ge) monocrystal, wherein the monocrystal is cylindrical and has a length of 1 cm to 300 cm, wherein the monocrystal has a resistivity of less than 10 mOhm·cm along a substantial portion of its length, and wherein phosphorus is a single dopant.

2. The phosphorus-doped, dislocation-free Ge monocrystal according to claim 1, wherein said dopant is comprised in an amount of $5 \times 10^{17}/cm^3$ to $2.5 \times 10^{19}/cm^3$.

3. The phosphorus-doped, dislocation-free Ge monocrystal according to claim 1, having a resistivity of 2.0 to 6.0 mOhm·cm.

4. The phosphorus-doped, dislocation-free Ge monocrystal according to claim 1, wherein said monocrystal is cylindrical and has a diameter of 1 cm to 50 cm.

5. The phosphorus-doped, dislocation-free Ge monocrystal according to claim 1, wherein said monocrystal is in the form of an ingot.

6. A wafer derived from the phosphorus-doped, dislocation-free Ge monocrystal of claim 1.

7. The wafer according to claim 6, wherein the Ge monocrystal has a resistivity of 2.0 to 6.0 mOhm·cm.

8. The wafer according to claim 6, wherein said wafer has a thickness of 25 to 1000 μm.

9. Process for the manufacture of the phosphorus-doped, dislocation-free Ge monocrystal according to claim 1, comprising the steps of:
   providing a Czochralski pulling furnace;
   feeding germanium and phosphorus into the furnace in such relative quantities as to obtain a dopant level of at least $1 \times 10^{18}/cm^3$; and,
   pulling a crystal.

10. Process according to claim 9, whereby phosphorus is fed into said furnace in the form of GeP.

11. Process according to claim 9, comprising the additional steps of:
    cutting the crystal into wafers;
    grinding the wafers with a coarse grit;
    chemical-mechanical polishing of the wafers; and
    cleaning the wafers' surface.

12. Electronic or opto-electronic device comprising the phosphorus-doped, dislocation-free Ge monocrystal according to claim 1.

13. Vertical-cavity surface emitting lasers or infrared plasmonic sensors comprising the phosphorus-doped, dislocation-free Ge monocrystal according to claim 1.

* * * * *